(12) United States Patent
Yang et al.

(10) Patent No.: US 8,004,042 B2
(45) Date of Patent: Aug. 23, 2011

(54) STATIC RANDOM ACCESS MEMORY (SRAM) CELL AND METHOD FOR FORMING SAME

(75) Inventors: Lie-Yong Yang, Hsin-Chu (TW);
Feng-Ming Chang, Chia-yi (TW);
Chang-Ta Yang, Hsin-Chu (TW);
Ping-Wei Wang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 12/408,193

(22) Filed: Mar. 20, 2009

(65) Prior Publication Data

US 2010/0237419 A1    Sep. 23, 2010

(51) Int. Cl.
*H01L 27/11* (2006.01)
*H01L 21/768* (2006.01)

(52) U.S. Cl. ......... 257/368; 257/E27.098; 257/E21.575; 365/181; 365/189.011

(58) Field of Classification Search .................. 257/202, 257/241, 368, 750, E21.641, E21.64, E21.279, 257/E27.099; 365/181, 156, 154, 189.011
See application file for complete search history.

(56) References Cited

U.S. PATENT DOCUMENTS

| | | | |
|---|---|---|---|
| 4,951,112 A | 8/1990 | Choi et al. | |
| 5,111,428 A | 5/1992 | Liang et al. | |
| 5,698,893 A | 12/1997 | Perera et al. | |
| 5,831,315 A | 11/1998 | Kengeri et al. | |
| 5,867,434 A | 2/1999 | Oh et al. | |
| 5,955,768 A | 9/1999 | Liaw et al. | |
| 5,973,364 A | 10/1999 | Kawanaka | |
| 6,285,088 B1 | 9/2001 | Madan | |
| 6,310,397 B1 | 10/2001 | Chang et al. | |
| 6,534,805 B1 | 3/2003 | Jin | |
| 6,596,466 B1 | 7/2003 | Pohland et al. | |
| 6,677,649 B2 | 1/2004 | Osada et al. | |
| 6,706,571 B1 | 3/2004 | Yu et al. | |
| 6,744,106 B2 | 6/2004 | Kanai | |
| 6,751,151 B2 | 6/2004 | Hsu et al. | |
| 6,768,144 B2 | 7/2004 | Houston et al. | |
| 6,858,478 B2 | 2/2005 | Chau et al. | |
| 6,864,519 B2 | 3/2005 | Yeo et al. | |
| 6,900,503 B2 | 5/2005 | Oh et al. | |
| 6,927,461 B2 | 8/2005 | Kim et al. | |
| 6,940,106 B2 | 9/2005 | Shino | |
| 6,977,512 B2 | 12/2005 | Duan et al. | |

(Continued)

*Primary Examiner* — Victor Mandala
*Assistant Examiner* — Whitney Moore
(74) *Attorney, Agent, or Firm* — Slater & Matsil, L.L.P.

(57) ABSTRACT

In accordance with an embodiment of the present invention, a static random access memory (SRAM) cell comprises a first pull-down transistor, a first pull-up transistor, a first pass-gate transistor, a second pull-down transistor, a second pull-up transistor, a second pass-gate transistor, a first linear intra-cell connection, and a second linear intra-cell connection. Active areas of the transistors are disposed in a substrate, and longitudinal axes of the active areas of the transistors are all parallel. The first linear intra-cell connection electrically couples the active area of the first pull-down transistor, the active area of the first pull-up transistor, and the active area of the first pass-gate transistor to a gate electrode of the second pull-down transistor and a gate electrode of the second pull-up transistor. The second linear intra-cell connection electrically couples the active area of the second pull-down transistor, the active area of the second pull-up transistor, and the active area of the second pass-gate transistor to a gate electrode of the first pull-down transistor and a gate electrode of the first pull-up transistor.

17 Claims, 6 Drawing Sheets

U.S. PATENT DOCUMENTS

| | | |
|---|---|---|
| 7,064,395 B2 | 6/2006 | Minami et al. |
| 7,176,125 B2 | 2/2007 | Liaw |
| 7,190,050 B2 | 3/2007 | King et al. |
| 7,247,887 B2 | 7/2007 | King et al. |
| 7,250,657 B2 | 7/2007 | Liaw |
| 7,259,979 B2 | 8/2007 | Sachan et al. |
| 7,265,008 B2 | 9/2007 | King et al. |
| 7,352,633 B2 | 4/2008 | Cherukuri |
| 7,508,031 B2 | 3/2009 | Liu et al. |
| 7,528,465 B2 | 5/2009 | King et al. |
| 7,605,449 B2 | 10/2009 | Liu et al. |
| 2005/0111251 A1 | 5/2005 | Liaw |
| 2005/0153490 A1 | 7/2005 | Yoon et al. |
| 2005/0275043 A1 | 12/2005 | Huang et al. |
| 2006/0019488 A1 * | 1/2006 | Liaw .......................... 438/637 |
| 2007/0076491 A1 | 4/2007 | Cherukuri |
| 2007/0080423 A1 | 4/2007 | Tsuboi et al. |
| 2007/0120156 A1 | 5/2007 | Liu et al. |
| 2007/0122953 A1 | 5/2007 | Liu et al. |
| 2007/0122954 A1 | 5/2007 | Liu et al. |
| 2007/0128782 A1 | 6/2007 | Liu et al. |
| 2007/0132053 A1 | 6/2007 | King et al. |
| 2007/0200182 A1 | 8/2007 | Liaw |
| 2007/0235765 A1 | 10/2007 | Liaw |
| 2007/0264762 A1 * | 11/2007 | Yeo et al. ...................... 438/157 |
| 2008/0273382 A1 | 11/2008 | Wang |
| 2008/0290470 A1 | 11/2008 | King et al. |
| 2008/0296632 A1 | 12/2008 | Moroz et al. |
| 2009/0181477 A1 | 7/2009 | King et al. |

* cited by examiner

STATIC RANDOM ACCESS MEMORY (SRAM) CELL AND METHOD FOR FORMING SAME

TECHNICAL FIELD

The present invention relates generally to semiconductor devices and, more particularly, to a static random access memory (SRAM) cell and a method for creating a SRAM cell.

BACKGROUND

Static Random Access Memory (SRAM) is chosen as a reliable, proven technology for high-performance stand-alone memory devices or embedded memory devices. The distinct advantages of an SRAM include fast access speed, low power consumption, high noise margin, and process compatibility with a conventional CMOS fabrication process, among others. However, the size of the SRAM cell is limited by problems encountered in processing. This prevents the use of SRAM in devices that require very small SRAM cells. Further, processing requirements of conventional SRAM cells hinder the use of fin field effect transistors (FinFETs) in the SRAM. Thus, there is a need for a layout of an SRAM cell that obviates processing problems for small cell sizes and allows for the application of FinFETs in SRAM.

A conventional 6T SRAM layout may be used in 90 nm, 65 nm, 45 nm, and 32 nm technology, but problems occur that can prevent using the layout for smaller technology. For instance, as the cell size becomes smaller, the individual components, such as the active areas of the transistors, the intra-cell connections, and contacts, would naturally need to become smaller. Unfortunately, current lithography and etching techniques limit the size of individual components. Hence, once the individual components decrease to the smallest possible size, if the cell size continues to decrease, the components will cause a greater density within the cell and may overlay other components. Any overlay would lead to a short circuit between different components causing device failure.

Generally, a 6T SRAM cell comprises two pass-gate transistors, two pull-down transistors, and two pull-up transistors. Each pass-gate transistor typically shares a source/drain region with one of the pull-down transistors. Due to the layout and the desired electrical characteristics of the pass-gate transistor and the pull-down transistor, the active area is frequently non-rectangular such that an active zag is created between the active areas of the pass-gate transistor and the pull-down transistor where the active area changes direction or widths. These active zags generally create problems with current mismatch between the pull-down and pull-up transistors and leakage current between the pass-gate and pull-down transistors. The problems generally arise because of weaknesses in processing sharp corners, such as those of the active zag. Also, a strong electric field around the corner may cause leakage problems.

In the conventional layout, the active areas of the pass-gate and pull-down transistors usually adjoin such that the lengths of the active areas of the transistors largely define a dimension of the cell layout. Further, a single contact is usually formed to the active areas of those transistors between each transistor's gate. As a result, if the contact cannot be etched any smaller, the contact may also be a limiting factor; otherwise, overlay of the contact with the gate electrode spacers may result and adversely affect performance. Thus, any limitation on the size of the contact or spacers can further define the dimension of the cell layout. The length of this dimension can result in long bitlines that can increase line capacitance and can slow the performance of the SRAM cell.

The conventional layout also usually includes a butted contact wherein the butted contact electrically couples a metal on a first metallization layer to a gate of the pull-down transistor and the pull-up transistor. These butted contacts generally require multiple etching steps because the components that are to be contacted are at different depths. The multiple etching steps may generally create more costs in processing and may cause more processing control problems.

Furthermore, the conventional layout also is not generally compatible with the process for building FinFETs. Generally FinFETs and tri-gate transistors need to be the same width in SRAM cells, but by making the transistors the same width in the conventional layout, SRAM issues, such as instability of the SRAM due to a beta-ratio that is too low, may arise.

Accordingly, there is a need for a SRAM layout that overcomes these deficiencies of the prior art. Embodiments of the invention seek to solve or obviate the limitations and problems of conventional SRAM layouts, as generally discussed above, and gain further advantages discussed herein.

SUMMARY OF THE INVENTION

These and other problems are generally solved or circumvented, and technical advantages are generally achieved, by embodiments of the present invention.

In accordance with an embodiment of the present invention, a static random access memory (SRAM) cell comprises a first pull-down transistor, a first pull-up transistor, a first pass-gate transistor, a second pull-down transistor, a second pull-up transistor, a second pass-gate transistor, a first linear intra-cell connection, and a second linear intra-cell connection. Active areas of the transistors are disposed in a substrate, and longitudinal axes of the active areas of the transistors are all parallel. The first linear intra-cell connection electrically couples the active area of the first pull-down transistor, the active area of the first pull-up transistor, and the active area of the first pass-gate transistor to a gate electrode of the second pull-down transistor and a gate electrode of the second pull-up transistor. The second linear intra-cell connection electrically couples the active area of the second pull-down transistor, the active area of the second pull-up transistor, and the active area of the second pass-gate transistor to a gate electrode of the first pull-down transistor and a gate electrode of the first pull-up transistor.

In accordance with another embodiment of the present invention, a SRAM cell comprises a plurality of transistors having active areas arranged in parallel in a semiconductor substrate, a first intra-cell connection on the semiconductor substrate, and a second intra-cell connection on the semiconductor substrate. The plurality of transistors comprise a first pass-gate transistor, a first pull-down transistor, a first pull-up transistor, a second pull-up transistor, a second pull-down transistor, and a second pass-gate transistor. The first intra-cell connection electrically couples an active area of the first pass-gate transistor, an active area of the first pull-down transistor, and an active area of the first pull-up transistor to a gate of the second pull-up transistor and a gate of the second pull-down transistor. The second intra-cell connection electrically couples an active area of the second pass-gate transistor, an active area of the second pull-down transistor, and an active area of the second pull-up transistor to a gate of the first pull-up transistor and a gate of the first pull-down transistor. The first intra-cell connection and the second intra-cell connection are linear.

In accordance with another embodiment of the present invention, a method for forming a SRAM cell, the method comprises forming transistors on a semiconductor substrate, and forming a first linear intra-cell connection and a second linear intra-cell connection. The transistors have active areas such that longitudinal axes of the active areas are parallel. The transistors include a first pull-down transistor, a first pull-up transistor, a second pull-down transistor, and a second pull-up transistor. The first pull-down transistor and the first pull-up transistor share a first common gate structure, and a second pull-down transistor and a second pull-up transistor share a second common gate structure. The first linear intra-cell connection electrically couples active areas of the first pull-down transistor and the first pull-down transistor to the second common gate structure, and the second linear intra-cell connection electrically couples active areas of the second pull-down transistor and the second pull-up transistor to the first common gate structure.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the present embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in a specific context, namely a 6T SRAM layout and a dual port SRAM layout. The invention may also be applied, however, to any kind of SRAM cell layout, including 10T SRAM layouts.

Figure 1A:
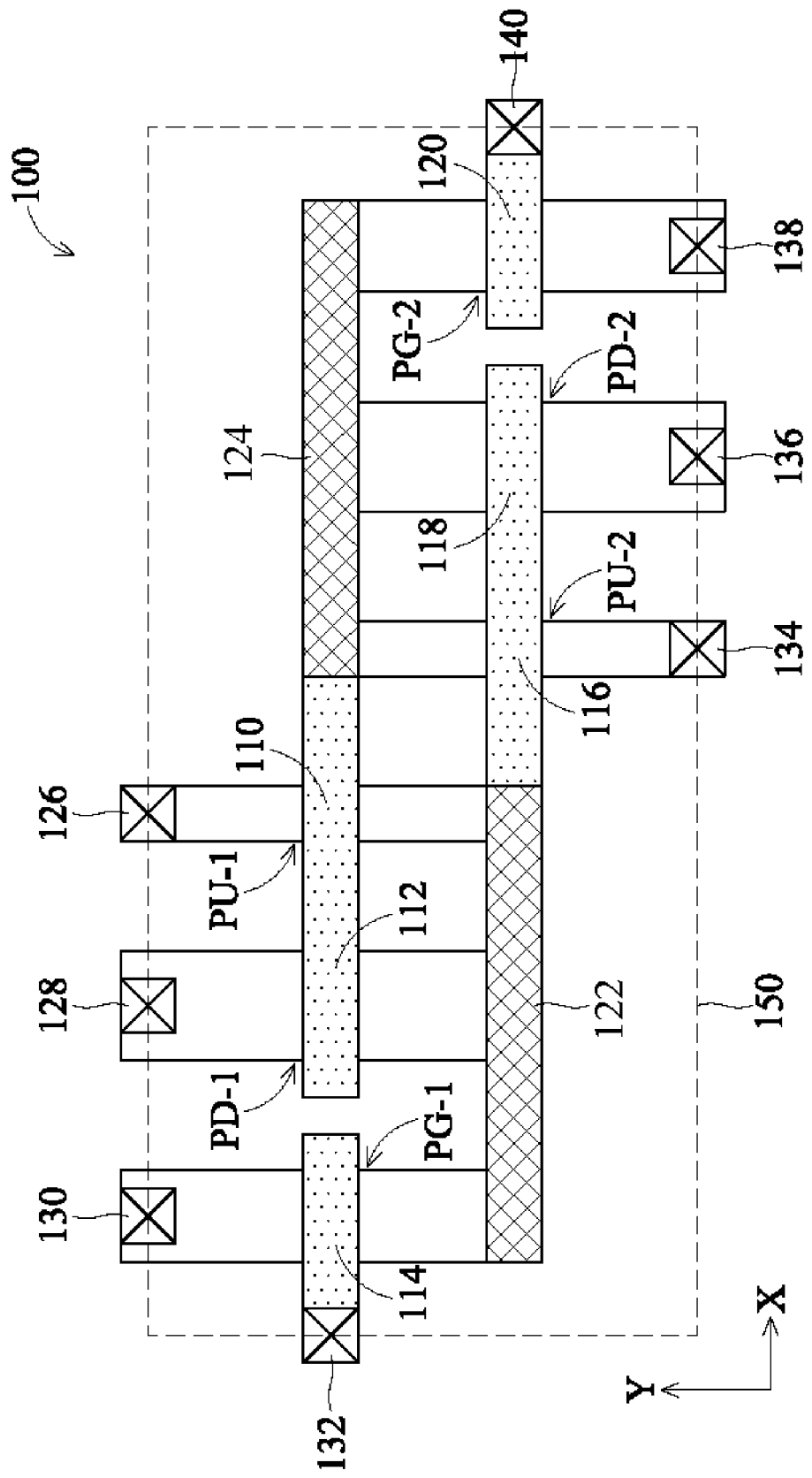
FIG. 1A is a layout of a 6T SRAM cell in accordance with an embodiment of the invention.

FIG. 1A shows a layout of a 6T SRAM cell 100 in accordance with embodiments of the invention. The memory cell layout 100 comprises a first pass-gate transistor PG-1, a second pass-gate transistor PG-2, a first pull-down transistor PD-1, a second pull-down transistor PD-2, a first pull-up transistor PU-1, and a second pull-up transistor PU-2 disposed in a semiconductor substrate. Each of the first pass-gate transistor PG-1, the second pass-gate transistor PG-2, the first pull-down transistor PD-1, the second pull-down transistor PD-2, the first pull-up transistor PU-1, and the second pull-up transistor PU-2 may be a FinFET.

The longitudinal axes of the active areas of the transistors are all parallel such that the direction of current flow when the transistors are operating is parallel. Further, the active areas of the first pass-gate transistor PG-1, the first pull-down transistor PD-1, and the first pull-up transistor PU-1 align with the second pull-up transistor PU-2 polysilicon gate 116 and the second pull-down transistor PD-2 polysilicon gate 118 such that a linear intra-cell connection 122 electrically couples the active areas of the first pass-gate transistor PG-1, the first pull-down transistor PD-1, and the first pull-up transistor PU-1 to the second pull-up transistor PU-2 polysilicon gate 116 and the second pull-down transistor PD-2 polysilicon gate 118. Likewise, the active areas of the second pass-gate transistor PG-2, the second pull-down transistor PD-2, and the second pull-up transistor PU-2 align with the first pull-up transistor PU-1 polysilicon gate 110 and the first pull-down transistor PD-1 polysilicon gate 112 allowing a linear intra-cell connection 124 to electrically couple the active areas of the second pass-gate transistor PG-2, the second pull-down transistor PD-2, and the second pull-up transistor PU-2 to the first pull-up transistor PU-1 polysilicon gate 110 and the first pull-down transistor PD-1 polysilicon gate 112.

The linear intra-cell connections 122 and 124 are located below the first metallization layer, e.g., on a metal 0 layer on the semiconductor substrate. The linear intra-cell connections 122 and 124 may electrically couple the respective polysilicon gates by physically adjoining or overlapping the respective polysilicon gates. In FIG. 1A, a single, continuous portion of polysilicon is the second pull-up transistor PU-2 polysilicon gate 116 and the second pull-down transistor PD-2 polysilicon gate 118. The linear intra-cell connection 122 may electrically couple these gates by physically adjoining or overlapping the single, continuous portion of polysilicon. Because of this coupling, no other contact is needed to connect the second pull-up transistor PU-2 polysilicon gate 116 and the second pull-down transistor PD-2 polysilicon gate 118 to the linear intra-cell connection 122. The linear intra-cell connection 124, the first pull-up transistor PU-1 polysilicon gate 110, and the first pull-down transistor PD-1 polysilicon gate 112 may likewise be formed. Persons having ordinary skill in the art will realize that metal, polysilicon, a silicide, or other conductive materials may be used to form the linear intra-cell connections and polysilicon gates.

Figure 1B:
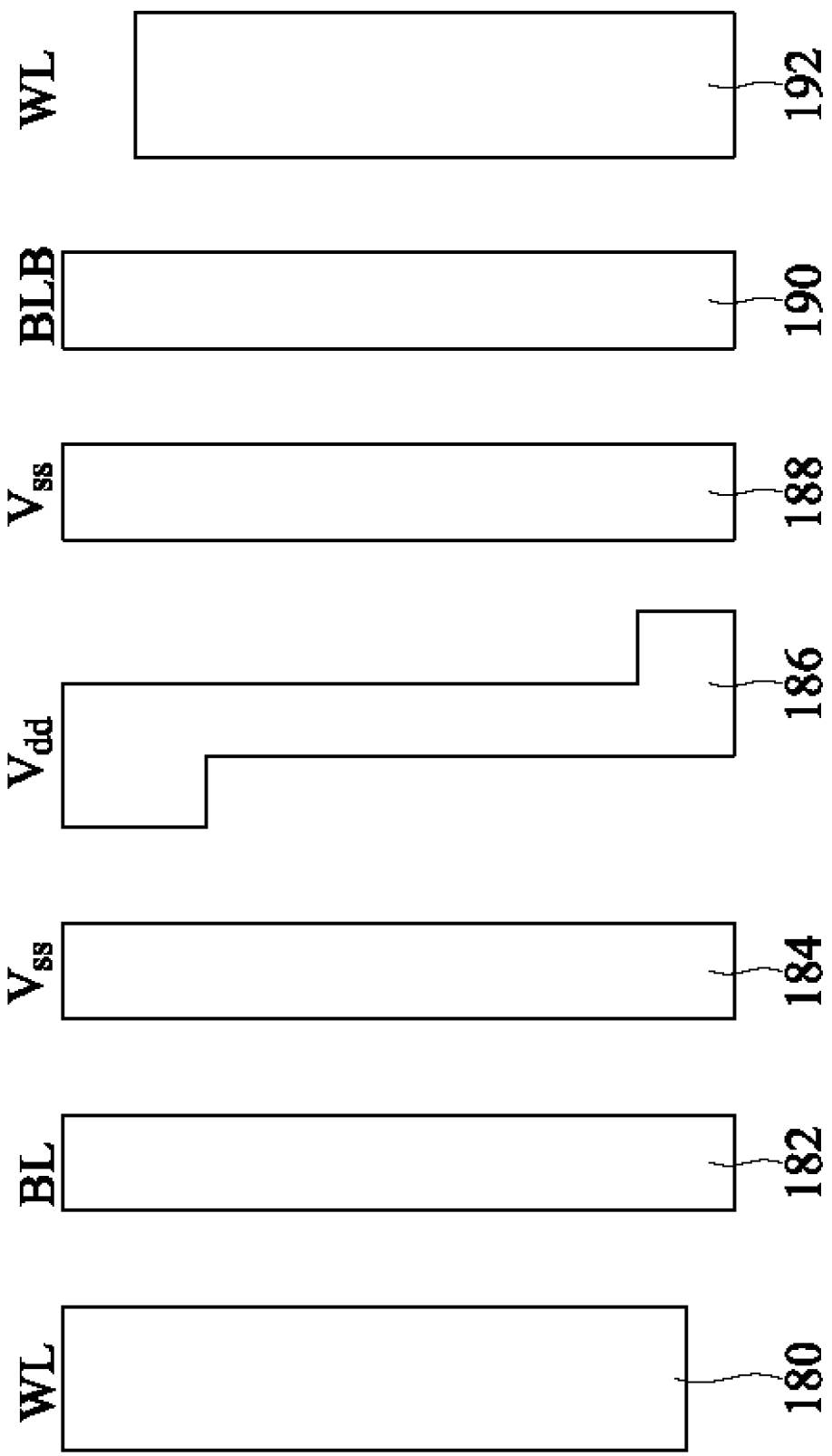
FIG. 1B is a first metallization layer for the layout of the 6T SRAM cell in accordance with an embodiment of the invention.

The transistors are also electrically coupled to a metallization layer that overlays the SRAM cell 100. FIG. 1B is an exemplary first metallization layer that overlays the SRAM cell 100 in accordance with an embodiment. The active area of the first pull-up transistor PU-1 is further electrically coupled by contact 126 (see FIG. 1A) to $V_{dd}$ trace 186. The active area of the first pull-down transistor PD-1 is electrically coupled by contact 128 (see FIG. 1A) to $V_{ss}$ trace 184. The active area of the first pass-gate transistor PG-1 is electrically coupled by contact 130 (see FIG. 1A) to bitline (BL) trace 182. The first pass-gate transistor PG-1 polysilicon gate 114 is electrically coupled by contact 132 (see FIG. 1A) to wordline (WL) pad 180.

The active area of the second pull-up transistor PU-2 is further electrically coupled by contact 134 (see FIG. 1A) to $V_{dd}$ trace 186. The active area of the second pull-down transistor PD-2 is electrically coupled by contact 136 (see FIG. 1A) to $V_{ss}$ trace 188. The active area of the second pass-gate transistor PG-2 is electrically coupled by contact 138 (see FIG. 1A) to complementary-BL (BLB) trace 190. The second pass-gate transistor PG-2 polysilicon gate 120 is electrically coupled by contact 140 (see FIG. 1A) to WL pad 192. Each trace and pad on the first metallization layer may be linear as illustrated in the embodiment in FIG. 1B, even though $V_{dd}$ trace 186 is not illustrated as linear.

Wordline traces are on a second metallization layer (not shown) overlaying the first metallization layer such that the second metallization layer is separated from the first metallization layer by a dielectric layer or other equivalent layers in an interconnect structure. The wordline traces electrically couple the WL pads 180 and 192 through vias in the dielectric layer or interconnect structure. A person having ordinary skill in the art will know that the wordline traces generally run perpendicular to the BL trace 182 and the BLB trace 190 such that the wordline traces are typically on a different metal layer than the BL trace 182 and the BLB trace 190. Otherwise, the traces herein discussed do not necessarily have to be on these layers and may be on any layer. For example, wordline traces may be on the first metallization layer along with BL and BLB pads such that the BL and BLB traces are on the second metallization layer and are electrically coupled to the BL and BLB pads. Also, the $V_{dd}$ trace 186 and the $V_{ss}$ traces 184 and 188 may be on any metallization layer without limitation.

The structure in FIG. 1A defines a unit or memory cell 150, as illustrated by the dotted line. The unit cell 150 defines the basic building block for designing memory cells and may be duplicated to create larger memories.

With the layout in FIG. 1A, many of the problems faced by the conventional layout are solved, or the impacts of the problems are decreased. First, the linear intra-cell connections 122 and 124 are not surrounded by other components in the cell so overlay is not as much of a problem and density is reduced. Further, each component extends in only one direction without any bends, i.e., unidirectional or linear, that makes processing control better. This allows for the layout to be used in 22 nm technology and smaller. Also, there is no need for a butted contact so processing is easier and requires fewer steps. Next, there is no active zag in the active areas of the transistors because each transistor active area is isolated and connected only with an intra-cell connection. Thus, leakage and current mismatch is less of a problem. Next, the y-dimension of the cell is no longer defined by two transistor lengths, but by one. This allows cells in a matrix to be denser in the y-direction to decrease the bitline distance and capacitance and increase the overall SRAM speed. Further, in the layout in FIG. 1A, the pass-gate and pull-down transistors may be made with differing widths, making the layout more compatible with FinFETs and tri-gate transistors because the zag in the active area is removed, which is preferred for FinFET processes such as Fin define, the dielectric and metal gate removal from the Fin sidewall, and Fin gap-fill.

Further advantages of the layout in FIG. 1A may be realized. First, one metal layer is saved. By placing the linear intra-cell connections 122 and 124 on the semiconductor substrate, a metal layer and the relevant contacts are unnecessary. Next, NMOS transistors are enhanced. An NMOS transistor is enhanced because a shallow trench isolation (STI) adjoining the transistor is shortened. In the conventional layout, the active areas of the pass-gate and pull-down transistors are connected, and a STI will continuously run along the side of the pass-gate and pull-down transistor active areas. In the layout in FIG. 1A, no two active areas are physically connected, and a STI will only run alongside a single transistor active area. Thus, the STI is shortened, thereby reducing the stress on the STI and enhancing the NMOS transistor. Additionally, in the layout in FIG. 1A, the pass-gate and pull-down transistors may be doped and tuned independently of each other because the transistor active areas are isolated. In the conventional layout, the pass-gate and pull-down transistor active areas abutted each other thus making separate tuning difficult. Even further, the processing for the polysilicon gate layer is more efficient and easier. The polysilicon gate is continuous in FIG. 1A making lithography and etch processes much easier.

Figure 2:
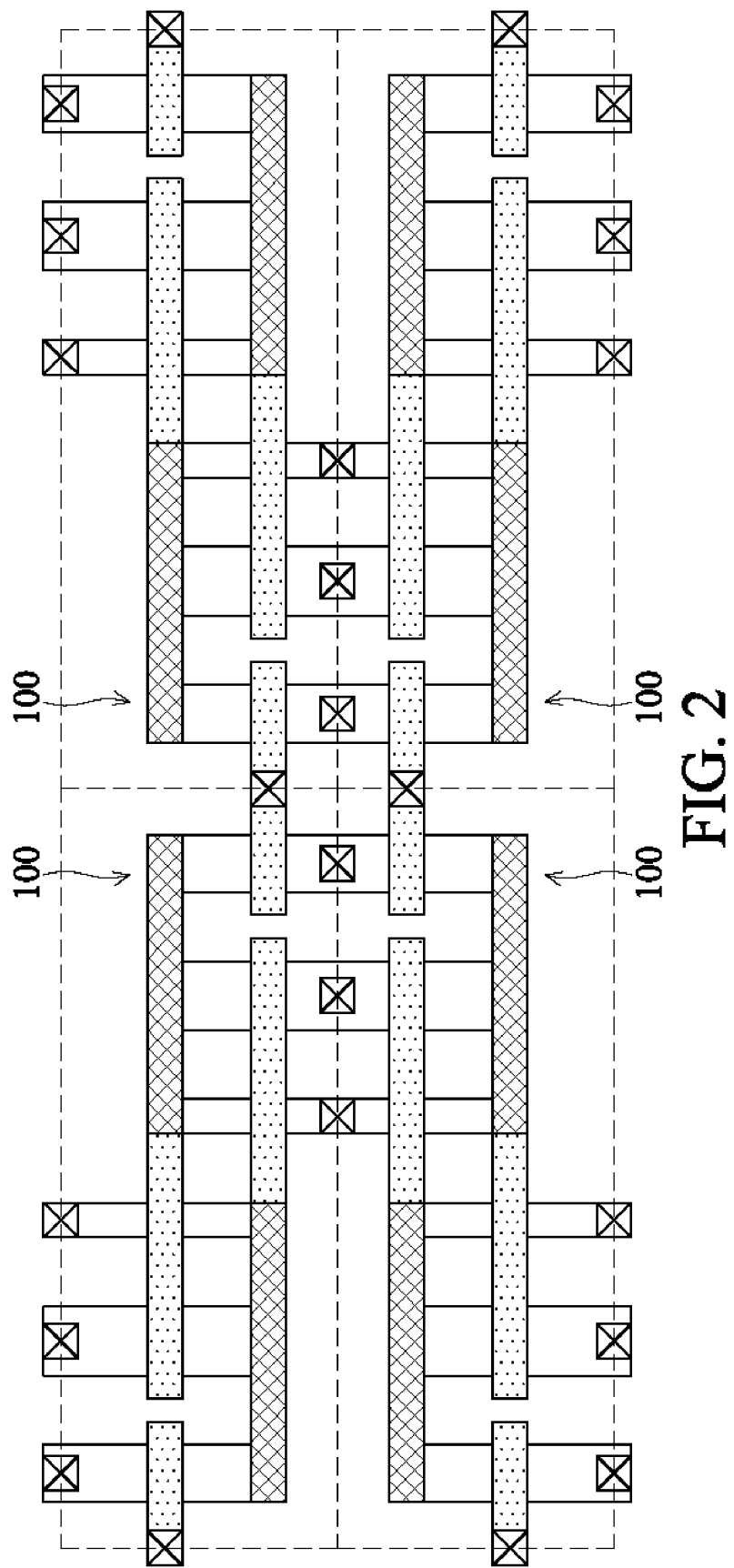
FIG. 2 is a four memory cell layout in accordance with an embodiment of the invention.
Figure 3:
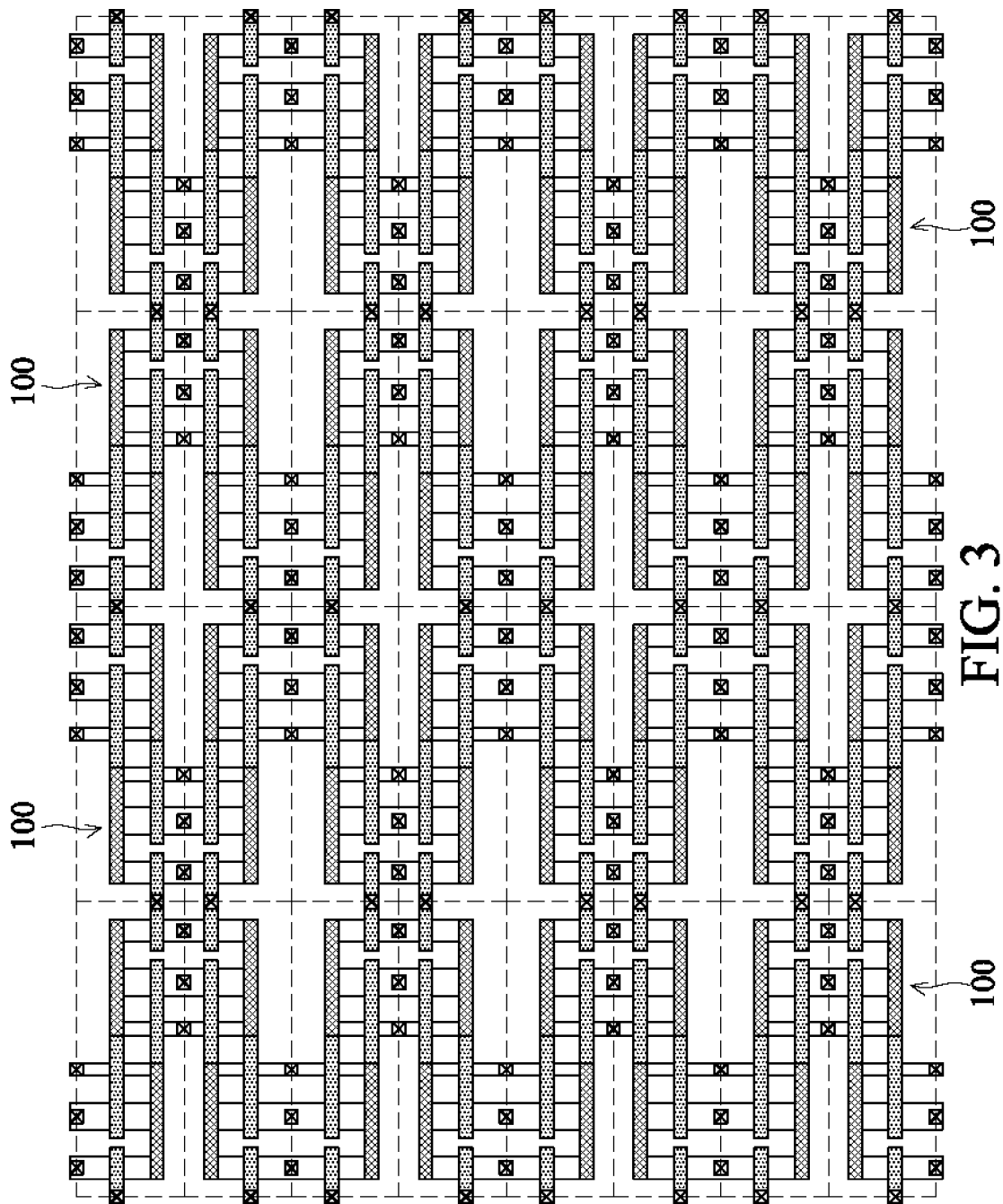
FIG. 3 is a thirty-two memory cell layout in accordance with another embodiment.

FIG. 2 shows a four memory cell 100 layout in accordance with an embodiment of the invention. FIG. 3 shows a thirty-two memory cell 100 layout in accordance with another embodiment. In each figure, the dashed lines mark the boundaries of each cell. For any particular memory cell, the layouts of the four memory cells adjoining a boundary of the particular memory cell are mirrored, flipped, inverted, or rotated around the boundary with respect to the particular memory cell layout. This allows the active areas or gates of the transistors along the boundary to share mutual contacts to traces on the metal layers discussed with regard to FIG. 1B.

Figure 4:
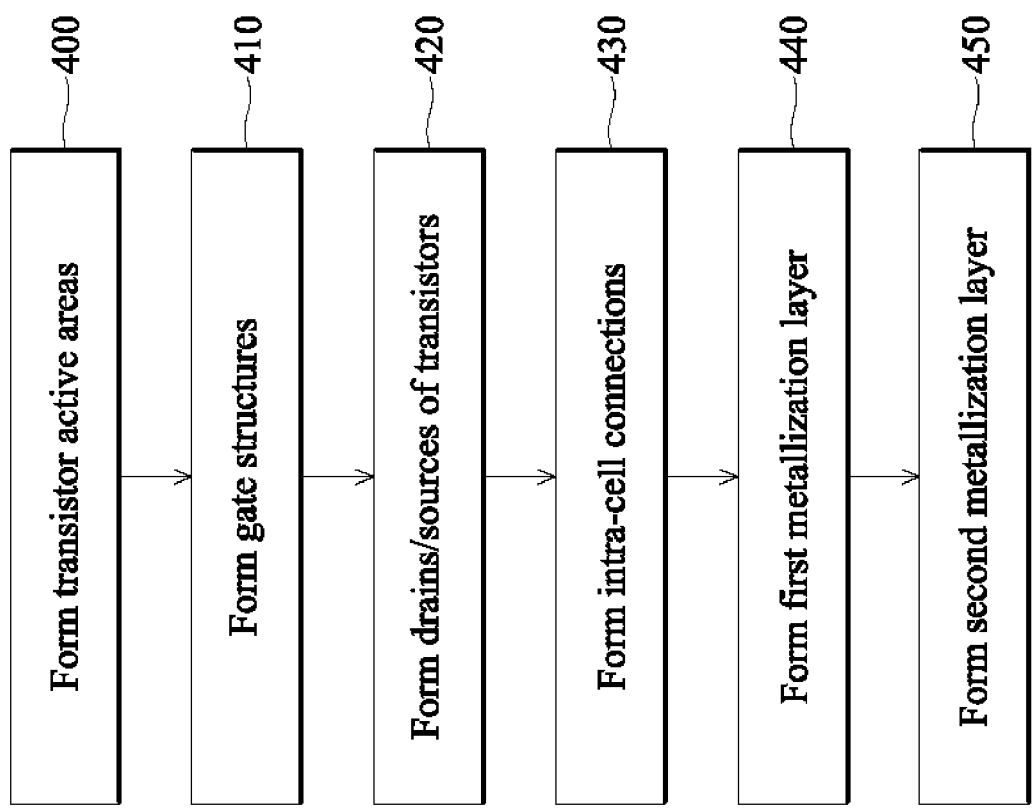
FIG. 4 is a flow chart of a process to form a memory cell in accordance with an embodiment of the invention.

FIG. 4 is a flow chart of a process to build a memory cell in accordance with an embodiment of the invention. While the process is described in accordance with an embodiment, the steps of the process may be performed in other orders, and the order discussed with reference to FIG. 4 does not limit any order of the steps described.

Step 400 is forming the transistor active areas in a semiconductor substrate. This step may comprise forming STIs around each transistor active area. Also, the active areas may be doped with the appropriate n-type or p-type dopants to create n-wells or p-wells for PMOS or NMOS transistors, respectively. Processing may require forming and patterning resist layers in order to form the STIs and the n-wells and p-wells as is known in the art. Alternatively, if FinFETs are to be formed, this step may comprise forming STIs and etching and doping the semiconductor substrate to form the FinFET active areas.

The longitudinal axis of each active area is formed parallel to the longitudinal axis of the other active areas. The longitudinal axis is in the same direction as the flow of current through the active areas when each active area is operating. Active areas for a first half of the memory cell's transistors (e.g., the first pass-gate transistor PG-1, the first pull-down transistor PD-1, and the first pull-up transistor PU-1 of FIG. 1A) are formed such that an axis that is perpendicular to the longitudinal axes of the active areas intersects each of the active areas of the first half. Likewise, active areas for a second half of the memory cell's transistors (e.g., the second pass-gate transistor PG-2, the second pull-down transistor PD-2, and the second pull-up transistor PU-2 of FIG. 1A) are formed. As described in greater detail below, this arrangement of the active areas allows for linear intraconnections to be formed overlying the source/drain regions.

Further, the active areas of the first half and the active areas of the second half are positioned with regard to the respective halves such that a linear intra-cell connection may be later formed electrically coupling the active areas of the first half to gate structures of some of the transistors of the second half and such that another linear intra-cell connection may be formed electrically coupling the active areas of the second have to gate structures of some of the transistors of the first half. For example in FIG. 1A, linear intra-cell connection 122 electrically couples the active areas of the first pass-gate transistor PG-1, the first pull-down transistor PD-1, and the first pull-up transistor PU-1 to the second pull-up transistor PU-2 polysilicon gate 116 and the second pull-down transistor PD-2 polysilicon gate 118, and linear intra-cell connection 124 electrically couples the active areas of the second pass-gate transistor PG-2, the second pull-down transistor PD-2, and the second pull-up transistor PU-2 to the first pull-up transistor PU-1 polysilicon gate 110 and the first pull-down transistor PD-1 polysilicon gate 112.

Step 410 is forming the transistor gate structures. This step may include forming a dielectric layer, possibly silicon dioxide, over the semiconductor substrate. Then a gate electrode layer is formed over the dielectric layer. This gate electrode layer may be polysilicon or metal. If polysilicon is used, in subsequent steps the gate electrode may be reacted with metal to form a silicide to reduce contact resistance. The dielectric layer and the gate electrode layer are then etched such that the layers remain only on the active areas to form gate electrodes. Similarly, if FinFETs are used, the gate structures will be formed over and around the transistor active areas.

Two transistors of the first half that are to be pull-down and pull-up transistors may have gates formed of a single piece of the gate electrode layer, though this is not necessary; the two transistors of the second half that are to be pull-down and pull-up transistors may be formed likewise. Also, dielectric spacers may be formed along the edges of the gate electrodes, and the gate electrodes may be doped as desired.

Step 420 is forming the source and drain regions of the transistors. This may involve doping the active areas on either side of the gate for each transistor. Different resist layers may be needed when doping transistors with p-type dopants and when doping transistors with n-type dopants.

Step 430 is forming the linear intra-cell connection. This may include forming a metal layer over the semiconductor substrate, patterning a resist layer over the metal, and etching away excess metal material that will not be formed into the linear intra-cell connection. Alternatively, a damascene process may be used to form the linear intra-cell connection. The metal electrically couples the active areas of a pass-gate transistor, a pull-down transistor, and a pull-up transistor to the gate structures of another pull-up transistor and pull-down transistor. Further, the metal may overlay portions of the gate electrode. Alternatively, polysilicon may be used instead of metal, and further, the polysilicon can be reacted with metal to form a metal silicide.

Step 440 is forming a first metallization layer. This may include a damascene or dual damascene process where a dielectric layer is formed over the memory cell and etched to form openings that will become contacts to the active areas or gates of the transistors and traces and pads of the first metallization layer, such as traces for $V_{dd}$, $V_{ss}$, bitline, and complementary bitline and pads for wordline. Then, a metal may be deposited into the openings to form the traces, pads, and contacts. Any excess metal may be removed, such as by a CMP process. This step may electrically couple the active areas of the transistors to the traces for $V_{dd}$, $V_{ss}$, bitline, and complementary bitline as appropriate and may couple wordline pads to the gates of the pass-gate transistors.

Step 450 is forming a second metallization layer. This may include a damascene or dual damascene process where a dielectric layer is formed over the memory cell and etched to form openings for vias and traces. The openings for the vias may be etched down to the pads of the first metallization layer. Then, a metal may be deposited into the openings to form the vias and traces. Any excess metal may be removed, such as by a CMP process. This step may electrically couple the gates of the pass-gate transistors to wordline traces.

Figure 5:
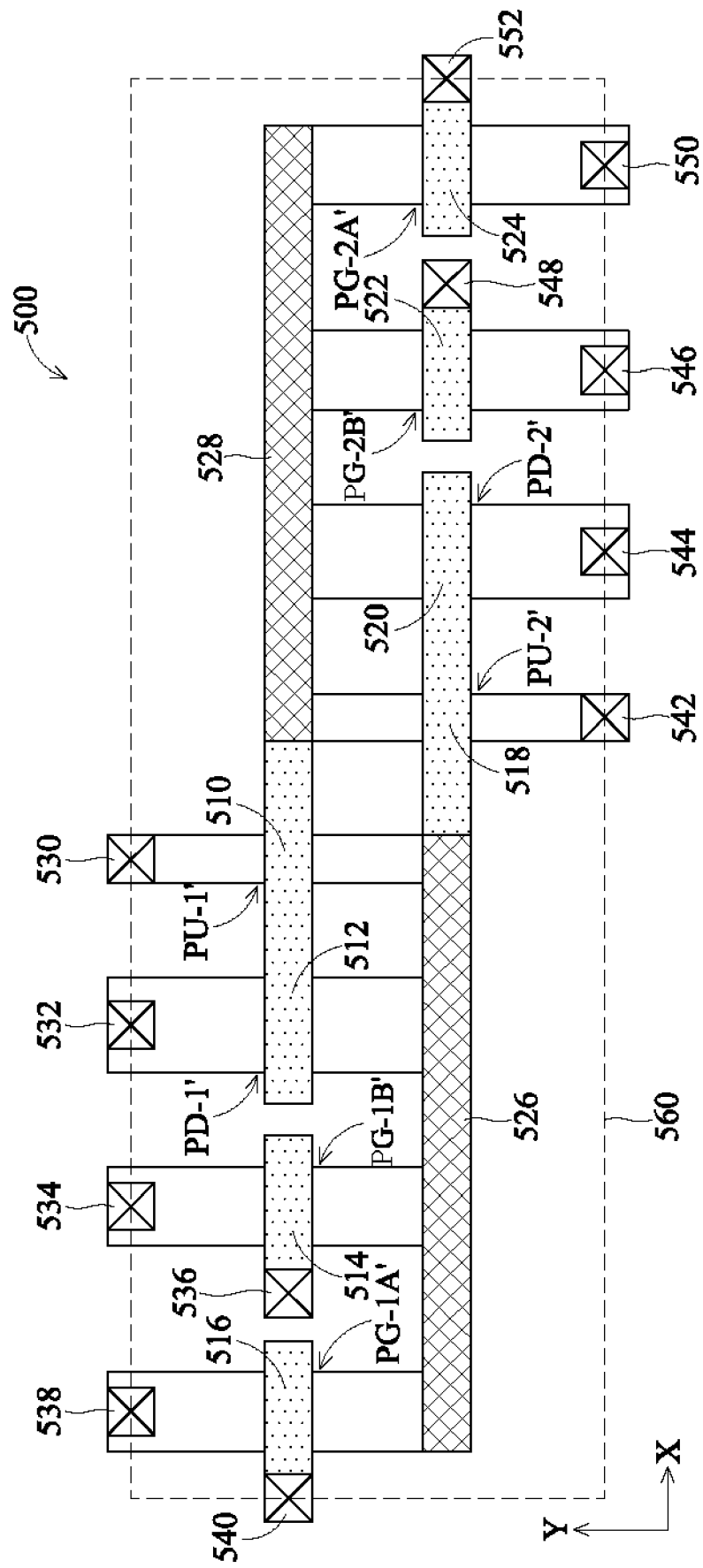
FIG. 5 is a layout of a dual port SRAM cell in accordance with another embodiment of the invention.

FIG. 5 illustrates a dual port SRAM memory cell 500 in accordance with another embodiment of the present invention. The memory cell 500 comprises a first read pass-gate transistor PG-1A', a first write pass-gate transistor PG-1B', a second read pass-gate transistor PG-2A', a second write pass-gate transistor PG-2B', a first pull-down transistor PD-1', a second pull-down transistor PD-2', a first pull-up transistor PU-1', and a second pull-up transistor PU-2' disposed in a semiconductor substrate.

The longitudinal axes of the active areas of the transistors are all parallel such that the direction of current flow when the transistors are operating is parallel. Further, the active areas of the first read pass-gate transistor PG-1A', the first write pass-gate transistor PG-1B', the first pull-down transistor PD-1', and the first pull-up transistor PU-1' align with the second pull-up transistor PU-2' polysilicon gate 518 and the second pull-down transistor PD-2' polysilicon gate 520 such that a linear intra-cell connection 526 electrically couples the active areas of the first read pass-gate transistor PG-1A', the first write pass-gate transistor PG-1B', the first pull-down transistor PD-1', and the first pull-up transistor PU-1' to the second pull-up transistor PU-2' polysilicon gate 518 and the second pull-down transistor PD-2' polysilicon gate 520. Likewise, the active areas of the second read pass-gate transistor PG-2A', the second write pass-gate transistor PG-2B', the second pull-down transistor PD-2', and the second pull-up transistor PU-2' align with the first pull-up transistor PU-1' polysilicon gate 510 and the first pull-down transistor PD-1' polysilicon gate 512 allowing a linear intra-cell connection 528 to electrically couple the active areas of the second read pass-gate transistor PG-2A', the second write pass-gate transistor PG-2B', the second pull-down transistor PD-2', and the second pull-up transistor PU-2' to the first pull-up transistor PU-1' polysilicon gate 510 and the first pull-down transistor PD-1' polysilicon gate 512.

The linear intra-cell connections 526 and 528 are located below the first metallization layer, e.g., on a metal 0 layer on the semiconductor substrate. Like with linear intra-cell connections 122 and 124 in FIG. 1A, the linear intra-cell connections 526 and 528 are on the semiconductor substrate like the polysilicon gates such that no other contact is needed to connect the gates to the linear intra-cell connections. Persons having ordinary skill in the art will realize that metal, polysilicon, a silicide, or other conductive materials may be used to form the linear intra-cell connections and polysilicon gates. The above structure defines a unit or memory cell 560, as illustrated by the dotted line.

The transistors are also electrically coupled to a first metallization layer overlaying the memory cell 500 through various contacts. The first metallization layer may be similar to the metallization layer depicted in FIG. 1B or the various alternatives described with respect to FIG. 1B. However, at least two additional pads and/or traces would be required on the first metallization layer to accommodate the additional wordlines and bitlines.

In one embodiment, the active area of the first pull-up transistor PU-1' is further electrically coupled by contact 530 to a $V_{dd}$ trace. The active area of the first pull-down transistor PD-1' is electrically coupled by contact 532 to a $V_{ss}$ trace. The active area of the first write pass-gate transistor PG-1B' is electrically coupled by contact 534 to a write bitline (BBL) trace. The first write pass-gate transistor PG-1B' polysilicon gate 514 is electrically coupled by contact 536 to a write wordline (WL-2) pad. The active area of the first read pass-gate transistor PG-1A' is electrically coupled by contact 538 to a read bitline (ABL) trace. The first read pass-gate transistor PG-1A' polysilicon gate 516 is electrically coupled by contact 540 to a read wordline (WL-1) pad.

The active area of the second pull-up transistor PU-2' is further electrically coupled by contact 542 to the $V_{dd}$ trace. The active area of the second pull-down transistor PD-2' is electrically coupled by contact 544 to another $V_{ss}$ trace. The active area of the second write pass-gate transistor PG-2B' is electrically coupled by contact 546 to a complementary-BBL trace. The second write pass-gate transistor PG-2B' polysilicon gate 522 is electrically coupled by contact 548 to another WL-2 pad. The active area of the second read pass-gate transistor PG-2A' is electrically coupled by contact 550 to a complementary-ABL trace. The second read pass-gate transistor PG-2A' polysilicon gate 524 is electrically coupled by contact 552 to another WL-1 pad.

Similar to FIG. 1B, in the embodiment illustrated by FIG. 5, read and write wordline traces are on a second metallization layer overlaying the first metallization layer such that the second metallization layer is separated from the first metallization layer by a dielectric layer or other equivalent layers in an interconnect structure. The read wordline traces electrically couple the WL-1 pads through vias in the dielectric layer or interconnect structure, and the write wordline traces electrically couple the WL-2 pads in a similar manner. The traces herein discussed do not necessarily have to be on these layers and may be on any layer.

Although the present invention and its advantages have been described in detail, it should be understood that various changes, substitutions and alterations can be made herein without departing from the spirit and scope of the invention as defined by the appended claims. Particularly, the positioning and/or alignment of the respective components of the SRAM cells described above do not have to be exactly positioned, aligned, or sized as depicted in the figures. For example, a person having ordinary skill in the art will know that variations from processing semiconductor devices may prevent exact alignment, and as such, small variations are considered within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A static random access memory (SRAM) cell comprising:
   a first pull-down transistor;
   a first pull-up transistor;
   a first pass-gate transistor;
   a second pull-down transistor;
   a second pull-up transistor;
   a second pass-gate transistor, wherein active areas of the transistors are disposed in a substrate, and wherein longitudinal axes of the active areas of the transistors are all parallel;
   a first linear intra-cell connection electrically coupling the active area of the first pull-down transistor, the active area of the first pull-up transistor, and the active area of the first pass-gate transistor to a gate electrode of the second pull-down transistor and a gate electrode of the second pull-up transistor, wherein all outer edges of a first top surface of the first linear intra-cell connection form one first rectangle of the first top surface, the first top surface being parallel to a substrate top surface, wherein a longitudinal axis of the first top surface aligns with the gate electrode of the second pull-down transistor and the gate electrode of the second pull-up transistor; and
   a second linear intra-cell connection electrically coupling the active area of the second pull-down transistor, the active area of the second pull-up transistor, and the active area of the second pass-gate transistor to a gate electrode of the first pull-down transistor and a gate electrode of the first pull-up transistor, wherein all outer edges of a second top surface of the second linear intra-cell connection form one second rectangle of the second top surface, the second top surface being parallel with the substrate top surface, wherein a longitudinal axis of the second top surface aligns with the gate electrode of the first pull-down transistor and the gate electrode of the first pull-up transistor.

2. The SRAM cell of claim 1 further comprising:
   a third pass-gate transistor, wherein an active area of the third pass-gate transistor is electrically coupled to the first linear intra-cell connection; and
   a fourth pass-gate transistor, wherein an active area of the fourth pass-gate transistor is electrically coupled to the second intra-cell connection, and wherein longitudinal axes of the active areas of the third pass-gate transistor and the fourth pass-gate transistor are parallel to the longitudinal axes of the active areas of the other transistors.

3. The SRAM cell of claim 1, wherein the first linear intra-cell connection and the second linear intra-cell connection are disposed on and adjoining the substrate.

4. The SRAM cell of claim 1, wherein the gate electrode of the second pull-down transistor and the gate electrode of the second pull-up transistor is a single, continuous gate electrode, and wherein the first linear intra-cell connection electrically couples the single, continuous gate electrode by overlaying and adjoining a portion of the single, continuous gate electrode.

5. The SRAM cell of claim 1, wherein the gate electrode of the first pull-down transistor and the gate electrode of the first pull-up transistor is a single, continuous gate electrode, and wherein the second linear intra-cell connection electrically couples the single, continuous gate electrode by overlaying and adjoining a portion of the single, continuous gate electrode.

6. The SRAM cell of claim 1 further comprising:
   a first metal layer comprising first layer traces, wherein a first trace of the first layer traces electrically couples the active area of the first pass-gate transistor, a second trace of first layer traces electrically couples the active area of the first pull-down transistor, a third trace of the first layer traces electrically couples the active area of the first pull-up transistor and the active area of the second pull-up transistor, a fourth trace of the first layer traces electrically couples the active area of the second pull-down transistor, and a fifth trace of the first layer traces electrically couples the active area of the second pass-gate transistor; and
   a second metal layer comprising second layer traces, wherein a first trace of the second layer traces electrically couples the gate electrode of the first pass-gate transistor, and a second trace of the second layer traces electrically couples the gate electrode of the second pass-gate transistor.

7. The SRAM cell of claim 6, wherein the first trace of the first layer traces, the second trace of the first layer traces, the fourth trace of the first layer traces, and the fifth trace of the first layer traces are linear, and wherein the first trace of the second layer traces and the second trace of the second layer traces are linear.

8. The SRAM cell of claim 1, wherein the transistors comprise fin field effect transistors.

9. The SRAM cell of claim 1, wherein the first intra-cell connection and the second intra-cell connection each comprise a metal, polysilicon, or a silicide.

10. The SRAM cell of claim 1, wherein none of the longitudinal axes of the active areas of the transistors are co-linear with another longitudinal axis of one of the active areas.

11. A static random access memory (SRAM) cell comprising:
a plurality of transistors having active areas arranged in parallel in a semiconductor substrate, wherein the plurality of transistors comprise a first pass-gate transistor, a first pull-down transistor, a first pull-up transistor, a second pull-up transistor, a second pull-down transistor, and a second pass-gate transistor;
a first intra-cell connection on the semiconductor substrate electrically coupling an active area of the first pass-gate transistor, an active area of the first pull-down transistor, and an active area of the first pull-up transistor to a gate of the second pull-up transistor and a gate of the second pull-down transistor, wherein the first intra-cell connection has a first cross-sectional area parallel to a top surface of the substrate, all outer edges of the first cross-sectional area forming a rectangle; and
a second intra-cell connection on the semiconductor substrate electrically coupling an active area of the second pass-gate transistor, an active area of the second pull-down transistor, and an active area of the second pull-up transistor to a gate of the first pull-up transistor and a gate of the first pull-down transistor, wherein the second intra-cell connection has a second cross-sectional area parallel to the top surface of the substrate, all outer edges of the first cross-sectional area forming a rectangle.

12. The SRAM cell of claim 11, wherein the plurality of transistors further comprise a third pass-gate transistor and a fourth pass-gate transistor, and wherein the first intra-cell connection electrically couples an active area of the third pass-gate transistor, and the second intra-cell connection electrically couples an active area of the fourth pass-gate transistor.

13. The SRAM cell of claim 11 further comprising:
a first metal layer comprising:
a bitline trace electrically coupled to the active area of the first pass-gate transistor;
a complementary bitline trace electrically coupled to the active area of the second pass-gate transistor;
at least two $V_{ss}$ traces, wherein one $V_{ss}$ trace is electrically coupled to the active area of the first pull-down transistor, and another $V_{ss}$ trace is electrically coupled to the active area of the second pull-down transistor; and
a $V_{dd}$ trace electrically coupled to the active area of the first pull-up transistor and the active area of the first pull-up transistor; and
a second metal layer comprising at least two wordline traces, wherein one wordline trace is electrically coupled to a gate of the first pass-gate transistor, and another wordline trace is electrically coupled to a gate of the second pass-gate transistor.

14. The SRAM cell of claim 13, wherein the bitline trace, the complementary bitline trace, and the at least two $V_{ss}$ traces are linear.

15. The SRAM cell of claim 11, wherein the plurality of transistors comprise fin field effect transistors.

16. The SRAM cell of claim 11, wherein none of the active areas of the plurality of transistors have a longitudinal axis that is co-linear with another longitudinal axis of another active area of the plurality of transistors.

17. The SRAM cell of claim 11, wherein a first longitudinal axis of the first intra-cell connection is aligned with the gate of the second pull-up transistor and the gate of the second pull-down transistor, and wherein a second longitudinal axis of the second intra-cell connection is aligned with the gate of the first pull-up transistor and the gate of the first pull-down transistor.

\* \* \* \* \*